(12) United States Patent
Lee et al.

(10) Patent No.: US 11,175,589 B2
(45) Date of Patent: Nov. 16, 2021

(54) AUTOMATIC WAVELENGTH OR ANGLE PRUNING FOR OPTICAL METROLOGY

(71) Applicants: Lie-Quan Lee, Fremont, CA (US); Leonid Poslavsky, Belmont, CA (US)

(72) Inventors: Lie-Quan Lee, Fremont, CA (US); Leonid Poslavsky, Belmont, CA (US)

(73) Assignee: KLA Corporation, Milpitas, CA (US)

( * ) Notice: Subject to any disclaimer, the term of this patent is extended or adjusted under 35 U.S.C. 154(b) by 1303 days.

(21) Appl. No.: 14/293,625

(22) Filed: Jun. 2, 2014

(65) Prior Publication Data

US 2014/0358485 A1 Dec. 4, 2014

Related U.S. Application Data

(60) Provisional application No. 61/830,543, filed on Jun. 3, 2013.

(51) Int. Cl.
*G01N 21/17* (2006.01)
*G03F 7/20* (2006.01)
(Continued)

(52) U.S. Cl.
CPC ......... *G03F 7/70625* (2013.01); *G01N 23/20* (2013.01); *G01D 21/00* (2013.01);
(Continued)

(58) Field of Classification Search
CPC .... G03F 7/70625; H05K 13/00; H05K 13/08; G01N 23/20; G01N 21/17; G01N 21/00;
(Continued)

(56) References Cited

U.S. PATENT DOCUMENTS 5,291,426 A * 3/1994 Collins .................. G01R 23/16
356/307
6,278,519 B1 8/2001 Rosencwaig et al.
(Continued)

FOREIGN PATENT DOCUMENTS

CN 101416043 4/2009
CN 101738871 6/2010
(Continued)

OTHER PUBLICATIONS

A New Theory of Wood's Anomalies on Optical Gratings, A. Hessel and A. A. Oliner, Applied Optics, vol. 4, Issue 10, pp. 1275-1297 (1965) http://dx.doi.org/10.1364/AO.4.001275.
(Continued)

*Primary Examiner* — Yoshihisa Ishizuka
(74) *Attorney, Agent, or Firm* — Womble Bond Dickinson (US) LLP

(57) ABSTRACT

Automatic wavelength or angle pruning for optical metrology is described. An embodiment of a method for automatic wavelength or angle pruning for optical metrology includes determining a model of a structure including a plurality of parameters; designing and computing a dataset of wavelength-dependent or angle-dependent data for the model; storing the dataset in a computer memory; performing with a processor an analysis of the dataset for the model including applying an outlier detection technology on the dataset, and identifying any data outliers, each data outlier being a wavelength or angle; and, if any data outliers are identified in the analysis of the dataset of the model, removing the wavelengths or angles corresponding to the data outliers from the dataset to generate a modified dataset, and storing the modified dataset in the computer memory.

28 Claims, 12 Drawing Sheets

(51) Int. Cl.
*G01N 23/20* (2018.01)
*G06Q 50/04* (2012.01)
*G06F 11/30* (2006.01)
*G01D 21/00* (2006.01)
*G05B 99/00* (2006.01)
*G06F 17/40* (2006.01)

(52) U.S. Cl.
CPC .............. *G05B 99/00* (2013.01); *G06F 11/30* (2013.01); *G06F 17/40* (2013.01); *G06Q 50/04* (2013.01); *Y02P 90/30* (2015.11)

(58) Field of Classification Search
CPC ...... G01N 21/84; G01N 23/00; G01N 23/203; G01N 23/22; Y02P 90/30; G06Q 50/00; G06Q 50/04; G06F 19/00; G06F 17/40; G06F 11/30; G01D 21/00; G05B 15/00; G05B 17/00; G05B 99/00
USPC .............. 73/865.8, 865.9, 866.3; 250/252.1; 356/237.1; 378/1, 70, 71, 82, 86; 438/14; 700/90, 95, 117, 121; 702/1, 81, 702/82, 85, 127, 187, 189, 190; 708/100, 708/200
IPC ........... G05B 15/00,17/00, 99/00; G06F 11/00, 11/30, 17/00, 17/40, 19/00; G06Q 50/00, 50/04; H05K 13/00, 13/08
See application file for complete search history.

(56) References Cited

U.S. PATENT DOCUMENTS

| | | | |
|---|---|---|---|
| 6,734,967 B1 | 5/2004 | Pinwonka-Corle et al. | |
| 7,031,848 B2 | 4/2006 | Opsal et al. | |
| 7,099,005 B1* | 8/2006 | Fabrikant | G01N 21/21 356/364 |
| 7,301,649 B2* | 11/2007 | Fabrikant | G01N 21/21 250/225 |
| 7,428,060 B2 | 9/2008 | Jin et al. | |
| 7,511,830 B2* | 3/2009 | Fabrikant | G01N 21/21 356/601 |
| 7,821,654 B2* | 10/2010 | Fabrikant | G01N 21/21 250/225 |
| 7,831,528 B2 | 11/2010 | Doddi et al. | |
| 8,560,270 B2 | 10/2013 | Chu | |
| 2003/0197872 A1 | 10/2003 | Littau et al. | |
| 2003/0225535 A1 | 12/2003 | Doddi et al. | |
| 2005/0274901 A1* | 12/2005 | Fabrikant | G01N 21/21 250/397 |
| 2006/0290947 A1 | 12/2006 | Li et al. | |
| 2008/0049214 A1 | 2/2008 | Maznev et al. | |
| 2008/0084567 A1* | 4/2008 | Fabrikant | G01N 21/21 356/521 |
| 2009/0012723 A1 | 1/2009 | Treado et al. | |
| 2009/0195779 A1 | 8/2009 | Fabrikant et al. | |
| 2010/0122225 A1 | 5/2010 | Cao et al. | |
| 2011/0128405 A1* | 6/2011 | Handa | B82Y 20/00 348/222.1 |
| 2011/0276319 A1 | 11/2011 | Madsen et al. | |
| 2011/0288822 A1 | 11/2011 | Veldman et al. | |
| 2012/0291952 A1* | 11/2012 | Davis | G03F 7/70625 156/345.25 |
| 2012/0323356 A1* | 12/2012 | Dziura | G01N 21/4788 700/121 |
| 2013/0004165 A1* | 1/2013 | Mun | H04B 10/07957 398/34 |
| 2014/0249768 A1* | 9/2014 | Vagos | G06F 17/00 702/104 |

FOREIGN PATENT DOCUMENTS

| | | |
|---|---|---|
| CN | 102947732 | 2/2013 |
| CN | 103003681 | 3/2013 |

OTHER PUBLICATIONS

Resonant Grating Waveguide Structures, David Rosenblatt, Avner Sharon, and Asher A. Friesem, IEEE Journal of Quantum Electronics, vol. 33, No. 11, Nov. 1997.

International Search Report and Written Opinion of the International Searching Authority dated Sep. 24, 2014, in International Patent Application No. PCT/US2014/040643, 15 pages.

Office Action of the Intellectual Property Office for Taiwanese Application No. 103119304 dated Jan. 5, 2018, 11 pages.

First Office Action Issued by State Intellectual Property Office for Chinese Application No. 201480039781.3 dated Apr. 2, 2018, 20 pages.

* cited by examiner

AUTOMATIC WAVELENGTH OR ANGLE PRUNING FOR OPTICAL METROLOGY

CROSS-REFERENCE TO RELATED APPLICATIONS

This application claims the benefit of U.S. Provisional Application No. 61/830,543, filed Jun. 3, 2013, the entire contents of which are hereby incorporated by reference herein.

TECHNICAL FIELD

Embodiments described herein generally relate to the field of metrology and, more particularly, automatic wavelength or angle pruning for optical metrology.

BACKGROUND

A rigorous coupled wave analysis (RCWA) and similar algorithms have been widely used for the study and design of diffraction structures. In the RCWA approach, the profiles of periodic structures are approximated by a given number of sufficiently thin planar grating slabs. Specifically, RCWA involves three main operations, namely, the Fourier expansion of the field inside the grating, calculation of the eigenvalues and eigenvectors of a constant coefficient matrix that characterizes the diffracted signal, and solution of a linear system deduced from the boundary matching conditions. RCWA divides the problem into three distinct spatial regions: (1) the ambient region supporting the incident plane wave field and a summation over all reflected diffracted orders, (2) the grating structure and underlying non-patterned layers in which the wave field is treated as a superposition of modes associated with each diffracted order, and (3) the substrate containing the transmitted wave field.

The input to the RCWA calculation is a profile or model of the periodic structure. In some cases cross-sectional electron micrographs are available (from, for example, a scanning electron microscope or a transmission electron microscope). When available, such images can be used to guide the construction of the model. However a wafer cannot be cross sectioned until all desired processing operations have been completed, which may take many days or weeks, depending on the number of subsequent processing operations. Even after all the desired processing operations are complete, the process to generate cross sectional images can take many hours to a few days because of the many operations involved in sample preparation and in finding the right location to image. Furthermore the cross section process is expensive because of the time, skilled labor and sophisticated equipment needed, and it destroys the wafer.

Multiple wavelengths are used in measuring critical dimensions (CDs) of a grating structure with optical metrology using spectroscopic ellipsometers or reflectometers. Wavelengths at or near a Wood Anomaly (referring to a wavelength of electromagnetic radiation passing through a grating that produces a significant variation in intensity in comparison with other wavelengths) or other resonant phenomena may show parameter sensitivity that are orders of magnitude larger than the wavelengths that are farther away from the resonant phenomenon. In reality, due to imperfections in manufacture and other factors, these overly sensitive wavelengths are not useful and introduce large measurement errors. In case of using angle-resolved ellipsometers or reflectometers, certain angles can also lead to Wood Anomaly or other resonant phenomena.

However, the determination of wavelengths and angles for exclusion from an optical metrology process can require great computational costs, thus complicating processes of optical metrology.

SUMMARY

Embodiments include automatic wavelength or angle pruning for optical metrology.

In a first embodiment, a method includes determining a model of a structure including a plurality of parameters; designing and computing a dataset of wavelength-dependent or angle-dependent data for the model; storing the dataset in a computer memory; performing with a processor an analysis of the dataset for the model including applying an outlier detection technology on the dataset, and identifying any data outliers, each data outlier being a wavelength or angle; and, if any data outliers are identified in the analysis of the dataset of the model, removing the wavelengths or angles corresponding to the data outliers from the dataset to generate a modified dataset, and storing the modified dataset in the computer memory.

In a second embodiment, a machine-accessible storage medium has instructions stored thereon that cause a data processing system to perform a method of automatic wavelength or angle pruning for optical metrology, the method including determining a model of a structure including a plurality of parameters; designing and computing a dataset of wavelength-dependent or angle-dependent data for the model; storing the dataset in a computer memory; performing with a processor an analysis of the dataset for the model including applying an outlier detection technology on the dataset, and identifying any data outliers, each data outlier being a wavelength or angle; and, if any data outliers are identified in the analysis of the dataset of the model, removing the wavelengths or angles corresponding to the data outliers from the dataset to generate a modified dataset, and storing the modified dataset in the computer memory.

In a third embodiment, a system includes an optical metrology system configured to determine the one or more process parameters of a target structure, the optical metrology system including a beam source and detector configured to measure a diffraction signal of the structure, a processor configured to process measurement data, and a computer memory to store data. The optical metrology system is configured to provide automatic wavelength or angle pruning for optical metrology, including determining a model of a structure including a plurality of parameters; designing and computing a dataset of wavelength-dependent or angle-dependent data for the model; storing the dataset in the computer memory; performing with the processor an analysis of the dataset for the model including applying an outlier detection technology on the dataset, and identifying any data outliers, each data outlier being a wavelength or angle; and if any data outliers are identified in the analysis of the dataset of the model, removing the wavelengths or angles corresponding to the data outliers from the dataset to generate a modified dataset, and storing the modified dataset in the computer memory.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Figure 1:
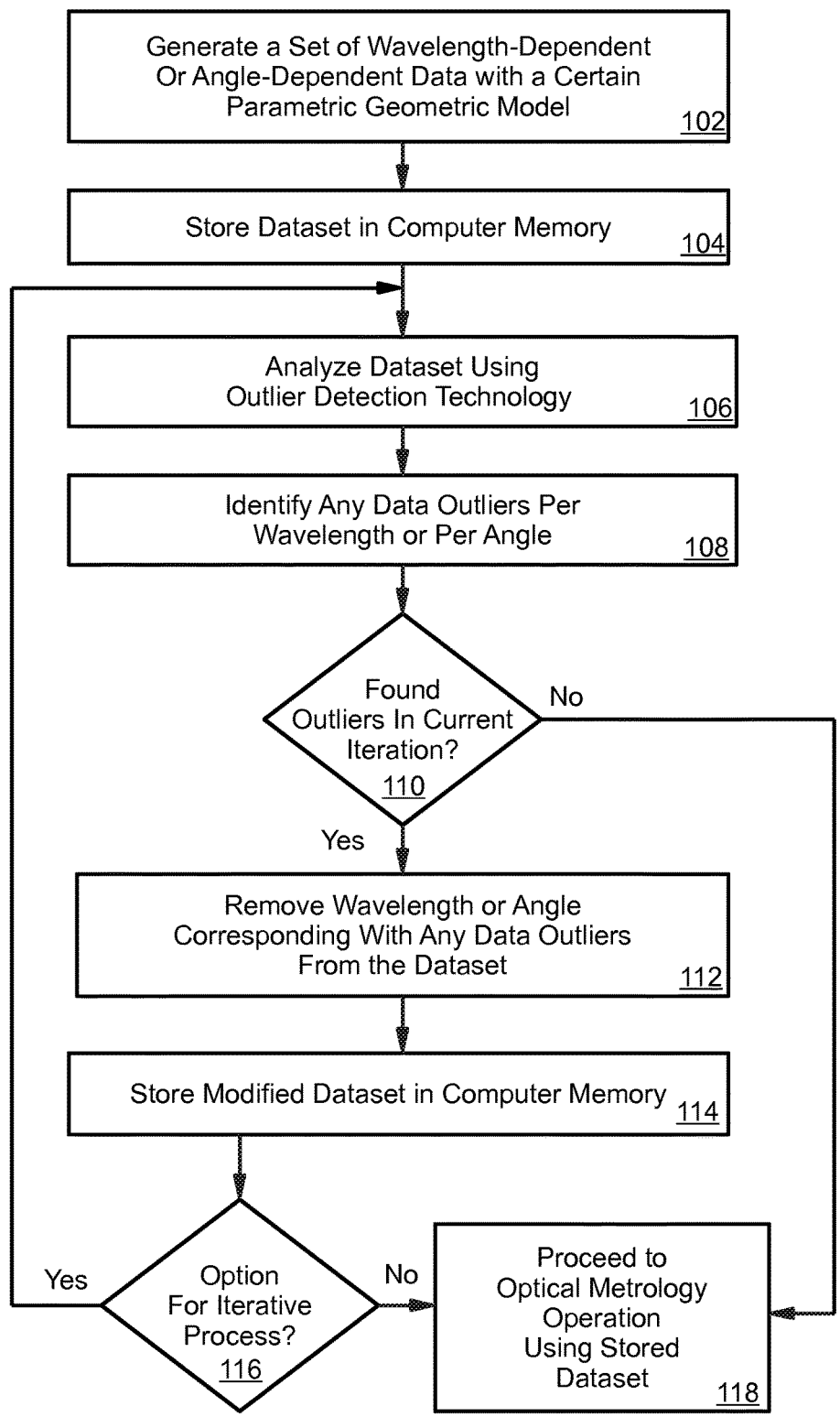
FIG. 1 is an illustration of an embodiment of a process for elimination of wavelength or angle outliers for optical metrology.

Embodiments described herein are generally directed to automatic wavelength or angle pruning for optical metrology.

In the following description, numerous specific details are set forth, such as specific approaches to dynamic removal of correlation of parameters, in order to provide a thorough understanding of embodiments of the present invention. It will be apparent to one skilled in the art that embodiments may be practiced without these specific details. In other instances, well-known processing operations, such as fabricating stacks of patterned material layers, are not described in detail in order to not unnecessarily obscure embodiments of the present invention. Furthermore, it is to be understood that the various embodiments shown in the figures are illustrative representations and are not necessarily drawn to scale.

Multiple wavelengths are used in measuring critical dimensions (CDs) of a grating structure with optical metrology using spectroscopic ellipsometers or reflectometers. Wavelengths at or near a Wood Anomaly (referring to a wavelength of electromagnetic radiation passing through a grating that produces a significant variation in intensity in comparison with other wavelengths) or other resonant phenomena may show parameter sensitivity that may be orders of magnitude larger than the wavelengths that are farther away from the resonant phenomenon. In reality, due to imperfection and other factors, those overly sensitive wavelengths are not useful and introduce large measurement errors. Therefore, such wavelengths generally should be excluded from the process of CD measurement.

In case of using angle-resolved ellipsometers or reflectometers, certain angles can also lead to Wood Anomaly or other resonant phenomena. Similar to the overly sensitive wavelengths in spectroscopic ellipsometers or reflectometers, such angles generally should also be excluded from the process of CD measurement.

One or more embodiments described herein are directed to automatic wavelength or angle pruning for measurement. Uses for such methods may include, for example, applications for metrology implementations such as optical metrology.

Conventional methods to address resonance issues may utilize electromagnetic calculation (including application of an electromagnetic solver) of the Wood Anomalies to identify the offending wavelengths. It is possible in theory to evaluate electromagnetic wave solutions of a series of structures with different parameters and different wavelengths or angles in order to identify resonances. In reality, such a process requires prohibitively high computational costs, and thus is impractical in general.

The conventional methods of determining wavelength of Wood Anomaly points are limited as the grating structures get more complicated. Further, there is no practical method to evaluate the resonance, as it would require prohibitively high computational cost to perform complete scanning and full evaluation of electromagnetic wave solutions for a parametric structure with different wavelengths, different angles, or both.

Embodiments of a method, apparatus, or system apply an advanced technology in data mining, the technology being multivariate outlier detection. Multivariate outlier detection is based on the idea that normal data follow the same general pattern, while the abnormal data (outliers) deviate from this and show different patterns.

According to one embodiment, an apparatus, system, or method provides for:

(1) Designing and computing a set of wavelength-dependent or angle-dependent data with a given parametric geometric model.

(2) Applying outlier detection technology to analyze the dataset, and identifying the data outliers per wavelength or per angle.

(3) Removing the wavelengths or angles corresponding to the data outliers. Repeating process (2) if necessary to identify all or most outliers in the database.

In an example, in the process (1) described above, it is possible to compute the derivatives (or their approximated derivatives) of spectra with respect to geometric parameters at equally spaced locations in the higher-dimensional space.

In some embodiments, once the datapoints of the dataset are designed and computed, multivariate outlier detection techniques are applied to the dataset. For example, distance-based algorithms (e.g. Mahalanobis distance and its variants), depth-based algorithms, deviation-based algorithms, and pattern-based algorithms may be applied in an embodiment.

In some embodiments, a threshold is utilized in an apparatus, system, or method to determine which datapoints are determined to be outliers. In some embodiments, heuristics may be used to determine an appropriate value for the threshold. In some embodiments, when a datapoint is beyond the threshold, the datapoint is identified as an outlier. The multivariate outlier detection algorithm may be executed multiple times because outliers can be hidden by other outliers. In some embodiments, once all (or most) outliers are found, the corresponding wavelengths or angles are removed.

In some embodiments, an apparatus, system, or process utilizes analysis of designed data patterns in the automatic pruning of outlying wavelengths, angles, or both, and does not require physical modeling of Wood anomalies or structure resonances. Physically modeling of a structure would generally require prohibitively high computational cost to identify resonances of real, complicated parametric structures. In contrast, an embodiment of an apparatus, system, or process requires relatively small computational resources and is capable of discovering and pruning all or most abnormal wavelengths or angles in a dataset.

In operation, because all or substantially all the abnormal wavelengths and angles are removed, the regression results will not be biased toward those overly sensitive (false) wavelength outliers, according to an embodiment. The libraries (namely the approximation functions to the spectra with respect to geometric parameters) are easier to obtain through data fitting. The measurement with those wavelengths excluded will be more accurate and stable.

In some embodiments, an apparatus, system, or method provides for pruning wavelengths with a Wood anomaly, pruning angles with a Wood anomaly, or both.

In some embodiments, an apparatus, system, or method provides for pruning wavelengths that are at or near structure resonances, pruning angles that are at or near structure resonances, or both.

In some embodiments, an apparatus, system, or method provides for pruning wavelengths, angles, or both that lead to abnormal spectra data and their derivatives.

In some embodiments, an apparatus, system, or method provides for pruning wavelengths, angles, or both without the application of electromagnetic solvers.

In some embodiments, an apparatus, system, or method provides for pruning wavelengths or angles for spectroscopic ellipsometers, angle-resolved ellipsometers, spectroscopic reflectometers, and angle-resolved reflectometers.

FIG. 1 is an illustration of an embodiment of a process for elimination of wavelength outliers, angle outliers, or both for optical metrology. In some embodiments, a set of wavelength or angle-dependent data for a certain parametric geometric model is generated 102, such as a model of a microelectronic structure, and the dataset is stored in a computer memory 104. The calculation methods for generating the original dataset can be any electromagnetic solvers, such as rigorous coupled wave analysis (RCWA), finite-element analysis, or other variants. In some embodiments, the generated dataset may be, for example, a two-dimensional grid with two floating parameters.

In some embodiments, the dataset is analyzed using outlier detection technology 106. In some embodiments, the dataset is analyzed using a computer processor, the computer processor being general-purpose processor, a dedicated processor, or other processing unit. The outlier detection algorithms applied in such technology may be, for example, distanced-based, density-based, depth-based, deviation-based, or pattern-based algorithms.

In some embodiments, any data outliers per wavelength or per angle are identified using the outlier detection technology 108. If no outliers were found in the current analysis and identification iteration 110, then the process proceeds to optical metrology operation using the stored dataset 118. If any outliers were found in the current analysis and identification iteration 110, then the wavelengths or angles corresponding with the identified data outliers are removed from the dataset 112 and the modified dataset is stored in the computer memory 114. In another embodiment, the wavelengths or angles may be removed when all outliers have been identified.

In some embodiments, if the process includes an option for an iterative process to further search for outliers 116, the process then returns to a further iteration of analysis of the dataset using outlier detection technology 106. In some embodiments, because certain data outliers may be hidden by other outliers, iterations of the process may continue until no additional outliers are identified. If the process does not include an option for the iterative process to further search for outliers, then the process proceeds to optical metrology operation using the stored dataset 118.

Figure 2:
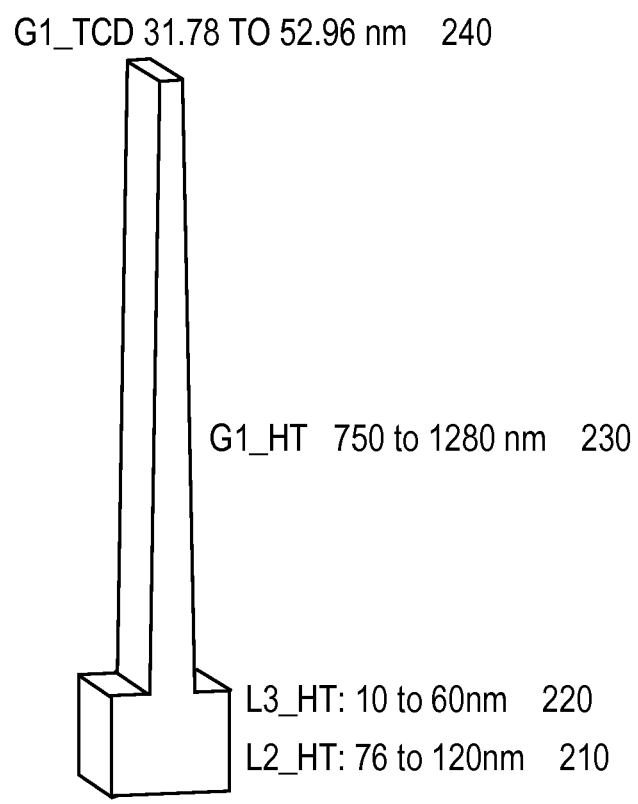
FIG. 2 is an illustration of a model of a structure in a process according to an embodiment.

FIG. 2 is an illustration of a model of a structure in a process according to an embodiment. In some embodiments, a testing project has a model of a structure shown in FIG. 2. In this particular example, initially 200 wavelengths ranged from 240 nm to 900 nm are used in the project. For purposes of this example, a 50 k training dataset is to create approximate functions but the resulting validation errors using regression are very large. In most cases, the 3 times standard deviation of errors is larger than 100 times of the parameter precision.

In some embodiments, a dataset is designed as follows:

1) For each floating parameter of the model of the structure, second layer height parameter L2_HT (HT=Height) (210 in FIG. 2), third layer height parameter L3_HT (220 in FIG. 2), G1 structure height parameter G1_HT (230 in FIG. 2), and G1 structure top critical dimension G1 TCD (TCD=Top Critical Dimension) (240 in FIG. 2), select one parameter and sample the values at, for example, regular intervals from the minimal value to the maximal value while fixing the other parameters to their nominal values.

2) Compute derivatives of the Mueller matrix element m00 for each wavelength with respect to the chosen floating parameter, wherein the computer using any applicable solver. (Mueller calculus is a matrix method for manipulating Stokes vectors, which represent the polarization of light. A Mueller matrix is a transfer matrix in the Stokes algebra that describes the polarization of light.) The derivatives are denoted $D(\lambda_j, p_i)$, where $\lambda_j$ and $p_i$ represent wavelength and parameter, respectively.

For a given wavelength (denoted as $\lambda_j$) and each floating parameter (denoted as $p_i$), there may be a set of derivative data at equally spaced locations. In some embodiments, a pattern-based outlier detection algorithm is used to determine whether dataset $D(\lambda_j, p_i)$ is an outlier. If the dataset is an outlier, $\lambda_j$ is marked for pruning.

Six wavelengths are identified for the example provided in FIG. 2. After the six detected wavelengths are removed from the dataset in computer memory, the approximation to spectra may be obtained with improved accuracy. In this example, the same 50 k training dataset is used to create the approximate functions, and the three times standard deviation of errors is less than the parameter precision. For the resulting dataset in this example, the enhancement of the approximation accuracy is 50 to 100 times.

Figure 3:
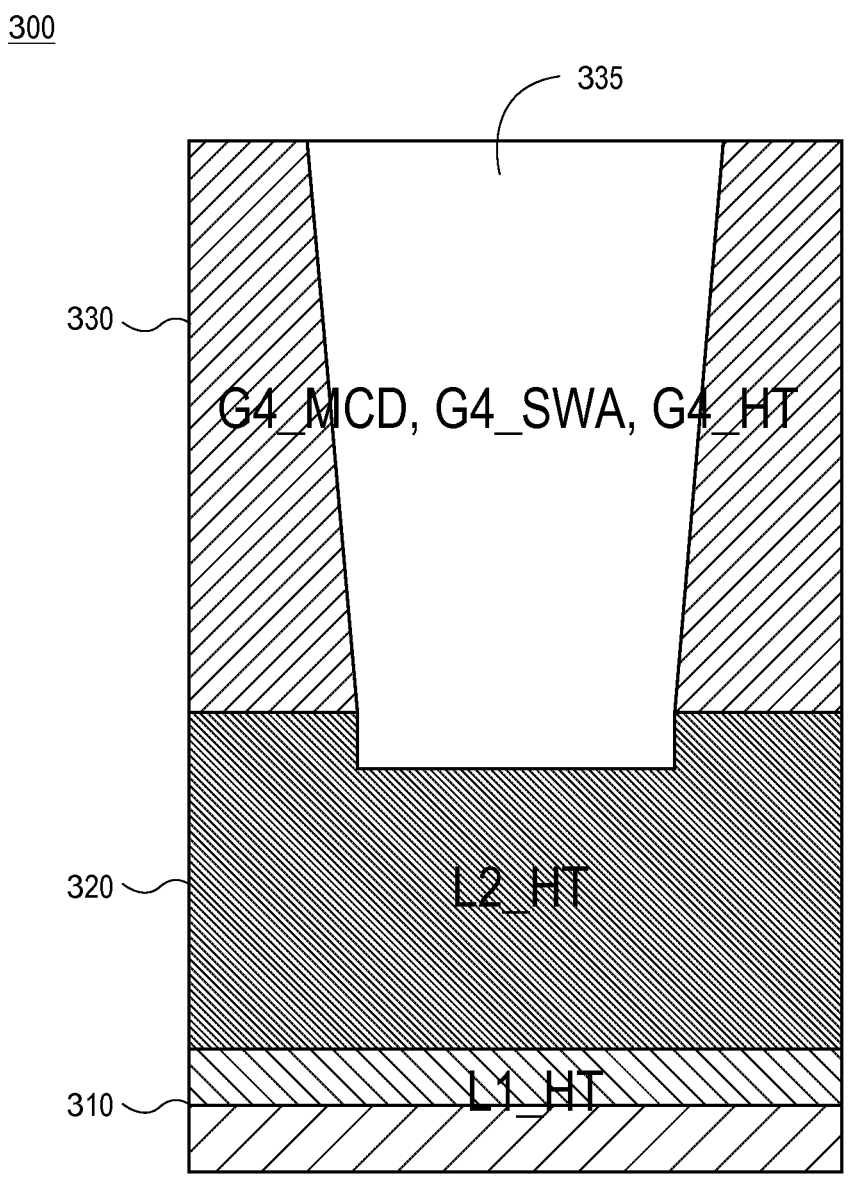
FIG. 3 is an illustration of a model subject to analysis for automatic wavelength or angle pruning for optical metrology according to an embodiment.

FIG. 3 is an illustration of a target model subject to analysis for automatic wavelength or angle pruning for optical metrology according to an embodiment. As illustrated, the structure 300 includes a first layer L1 310, a second layer L2 320, and a structure G4 with sidewall 330 and channel 335. In some embodiments, a model includes a first layer height parameter (L1_HT), a second layer height parameter (L2_HT), and parameters for G4, the parameters being a middle critical dimension parameter (G4_MCD), a sidewall angle parameter (G4_SWA), and height parameter (G4_HT).

Figure 4:
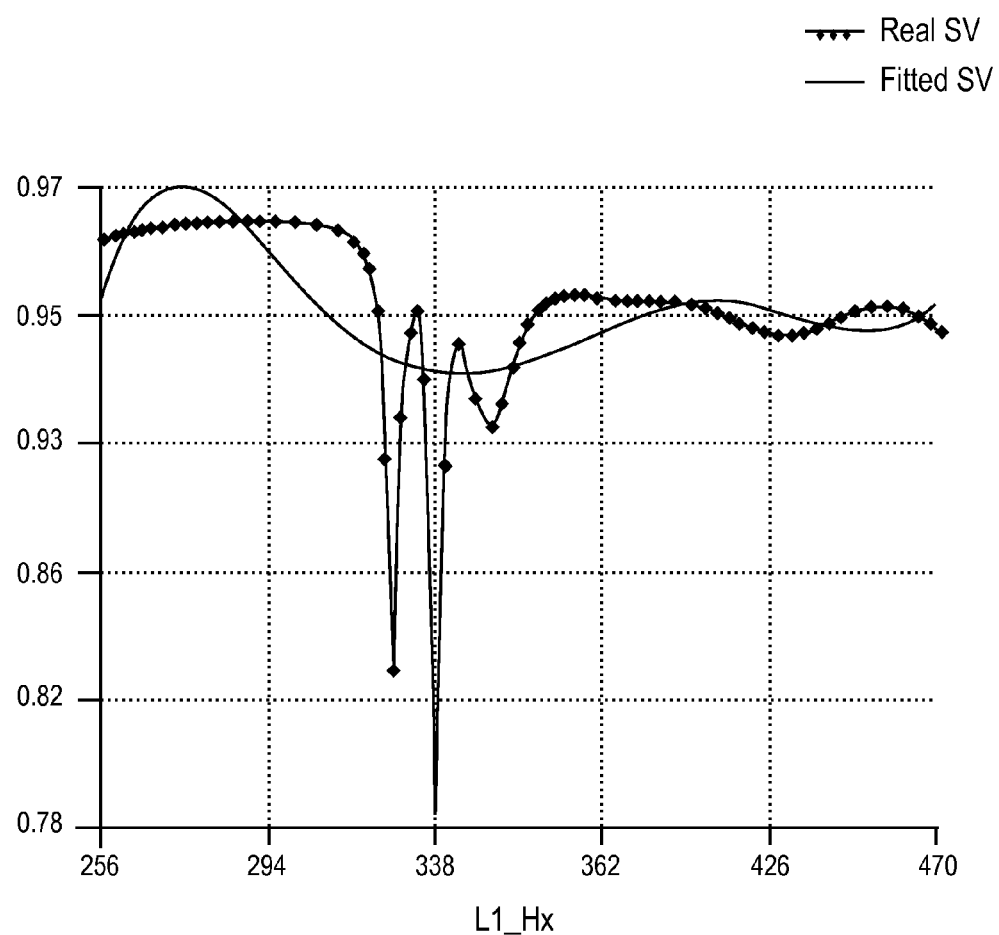
FIG. 4 illustrates an example of spectra values for a wavelength or angle to be automatically pruned according to an embodiment.

FIG. 4 illustrates an example of spectra values for a wavelength or angle to be automatically pruned according to an embodiment. In this example, the automatic wavelength or angle pruning may apply to structure 300 illustrated in FIG. 3. In this illustration, a first Mueller element is illustrated over the range of parameter L2_HT with wavelength around 711.765 nm. In FIG. 4, the line with marks represents the real spectra values while the one without marks represents fitted spectra values. The spiky pattern demonstrates that this wavelength deviates from a normal smooth response and is an outlier. In some embodiments, an apparatus, system, or method operates to automatically identify this wavelength and exclude the wavelength from the measurement process.

In some embodiments, an apparatus, system, or method providing for automatic wavelength or angle pruning may assist applications in tackling otherwise mysterious problems of mismatch of OCD (optical critical dimension) scatterometry results versus TEM (transmission micron microscopy) results due to the use of wavelengths in or near resonances, which provide false sensitivity information.

This application incorporates by reference in its entirety for all purposes U.S. patent application Ser. No. 12/331,192 filed Dec. 9, 2008, now U.S. Pat. No. 8,560,270, and titled "Rational approximation and continued-fraction approximation approaches for computation efficiency of diffraction signals."

In general, orders of a diffraction signal may be simulated as being derived from a periodic structure. The zeroth order represents a diffracted signal at an angle equal to the angle of incidence of a hypothetical incident beam, with respect to the normal N of the periodic structure. Higher diffraction orders are designated as +1, +2, +3, −1, −2, −3, etc. Other orders known as evanescent orders may also be considered. In accordance with an embodiment, a simulated diffraction signal is generated for use in optical metrology. For example, profile parameters, such as structural shape and film thicknesses, may be modeled for use in optical metrology. Optical properties of materials, such as index of refraction and coefficient of extinction, (n & k), in structures may also be modeled for use in optical metrology.

Figure 5:
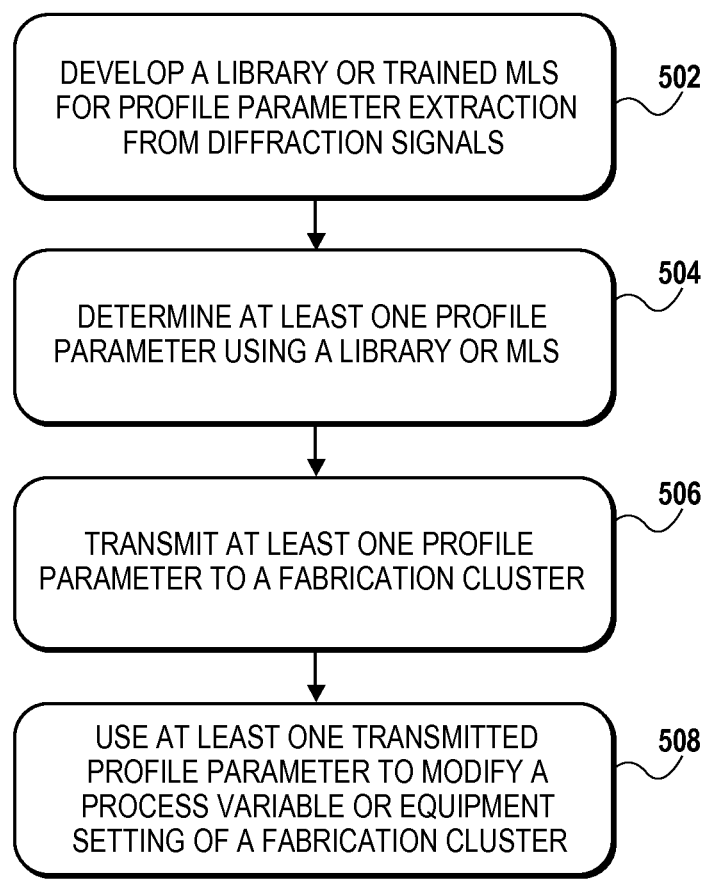
FIG. 5 depicts a flowchart representing an exemplary series of operations for determining and utilizing structural parameters for automated process and equipment control in accordance with an embodiment.

Calculations based on simulated diffraction orders may be indicative of profile parameters for a patterned film, such as a patterned semiconductor film or structure based on a stack of films, and may be used for calibrating automated processes or equipment control. FIG. 5 depicts a flowchart 500 representing an exemplary series of operations for determining and utilizing structural parameters for automated process and equipment control in accordance with an embodiment.

Referring to operation 502 of flowchart 500, a library or trained machine learning systems (MLS) is developed to extract parameters from a set of measured diffraction signals. In operation 504, at least one parameter of a structure is determined using the library or the trained MLS. In operation 506, the at least one parameter is transmitted to a fabrication cluster configured to perform a processing operation, where the processing operation may be executed in the semiconductor manufacturing process flow either before or after measurement operation 504 is made. In operation 508, the at least one transmitted parameter is used to modify a process variable or equipment setting for the processing operation performed by the fabrication cluster.

For a more detailed description of machine learning systems and algorithms, see U.S. Pat. No. 7,831,528, entitled OPTICAL METROLOGY OF STRUCTURES FORMED ON SEMICONDUCTOR WAFERS USING MACHINE LEARNING SYSTEMS, filed on Jun. 27, 2003, which is incorporated herein by reference in its entirety. For a description of diffraction order optimization for two-dimensional repeating structures, see U.S. Pat. No. 7,428,060, entitled OPTIMIZATION OF DIFFRACTION ORDER SELECTION FOR TWO-DIMENSIONAL STRUCTURES, filed on Mar. 24, 2006, which is incorporated herein by reference in its entirety.

Figure 6:
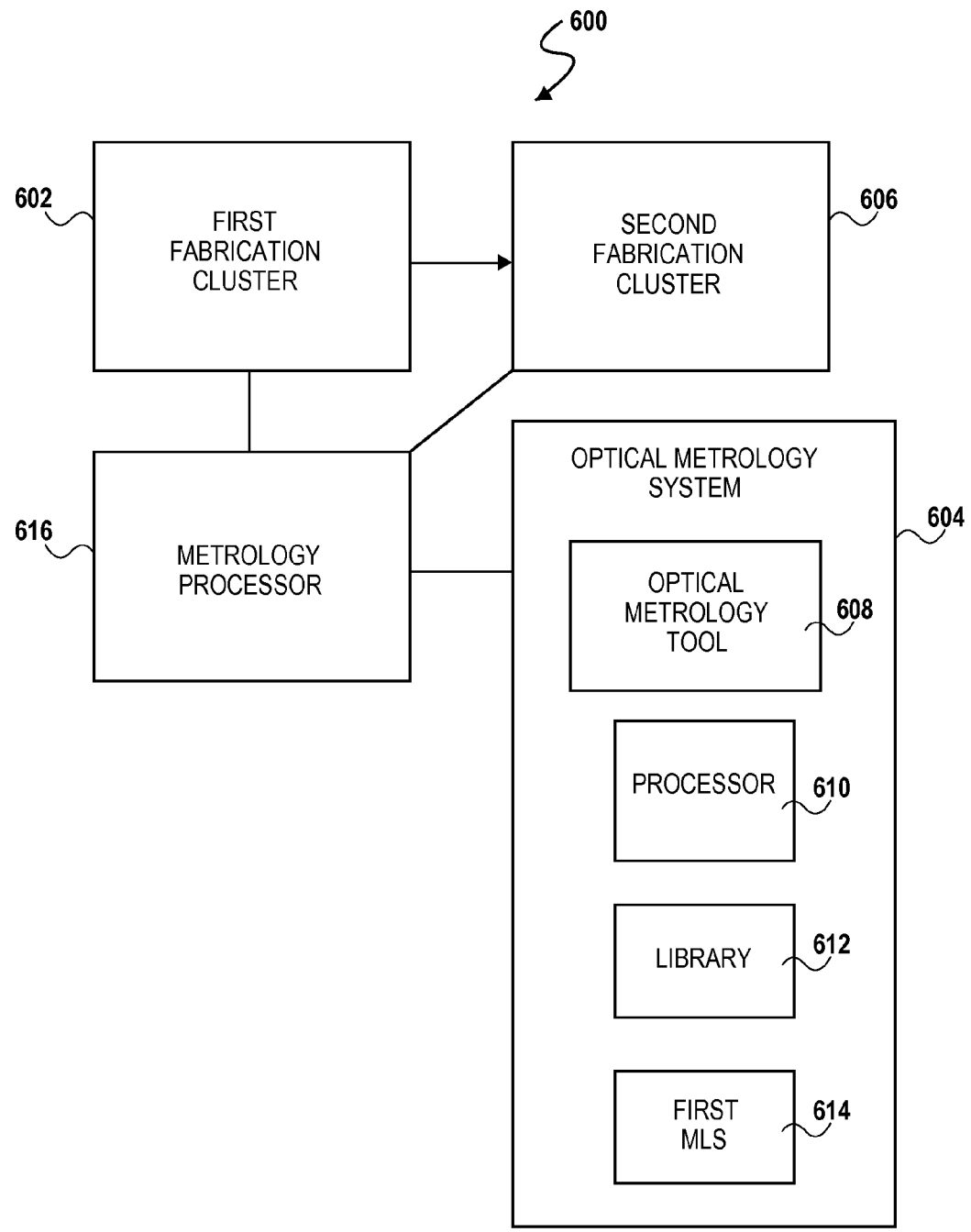
FIG. 6 is an exemplary block diagram of a system for determining and utilizing structural parameters for automated process and equipment control in accordance with an embodiment.

FIG. 6 is an exemplary block diagram of a system 600 for determining and utilizing structural parameters, such as profile or film thickness parameters, for automated process and equipment control in accordance with an embodiment. System 600 includes a first fabrication cluster 602 and optical metrology system 604. System 600 also includes a second fabrication cluster 606. Although the second fabrication cluster 606 is depicted in FIG. 6 as being subsequent to first fabrication cluster 602, it should be recognized that second fabrication cluster 606 can be located prior to first fabrication cluster 602 in system 600 (and, e.g., in the manufacturing process flow).

In one exemplary embodiment, optical metrology system 604 includes an optical metrology tool 608 and processor 610. Optical metrology tool 608 is configured to measure a diffraction signal obtained from the structure. If the measured diffraction signal and the simulated diffraction signal match, one or more values of the profile or film thickness parameters are determined to be the one or more values of the profile or film thickness parameters associated with the simulated diffraction signal.

In one exemplary embodiment, optical metrology system 604 can also include a library 612 with a plurality of simulated diffraction signals and a plurality of values of, e.g., one or more profile or film thickness parameters associated with the plurality of simulated diffraction signals. As described above, the library can be generated in advance. Processor 610 can be used to compare a measured diffraction signal obtained from a structure to the plurality of simulated diffraction signals in the library. When a matching simulated diffraction signal is found, the one or more values of the profile or film thickness parameters associated with the matching simulated diffraction signal in the library is assumed to be the one or more values of the profile or film thickness parameters used in the wafer application to fabricate the structure. In some embodiments, the processor 610 provides some or all of the processing for automatic wavelength or angle pruning for optical metrology.

System 600 also includes a metrology processor 616. In one exemplary embodiment, processor 610 can transmit the one or more values of the, e.g., one or more profile or film thickness parameters to metrology processor 616. Metrology processor 616 can then adjust one or more process parameters or equipment settings of first fabrication cluster 602 based on the one or more values of the one or more profile or film thickness parameters determined using optical metrology system 604. Metrology processor 616 can also adjust one or more process parameters or equipment settings of the second fabrication cluster 606 based on the one or more values of the one or more profile or film thickness parameters determined using optical metrology system 604. As noted above, fabrication cluster 606 can process the wafer before or after fabrication cluster 602. In another exemplary embodiment, processor 610 is configured to train machine-learning system 614 using the set of measured diffraction signals as inputs to machine learning system 614 and profile or film thickness parameters as the expected outputs of machine learning system 614.

Figure 7A:
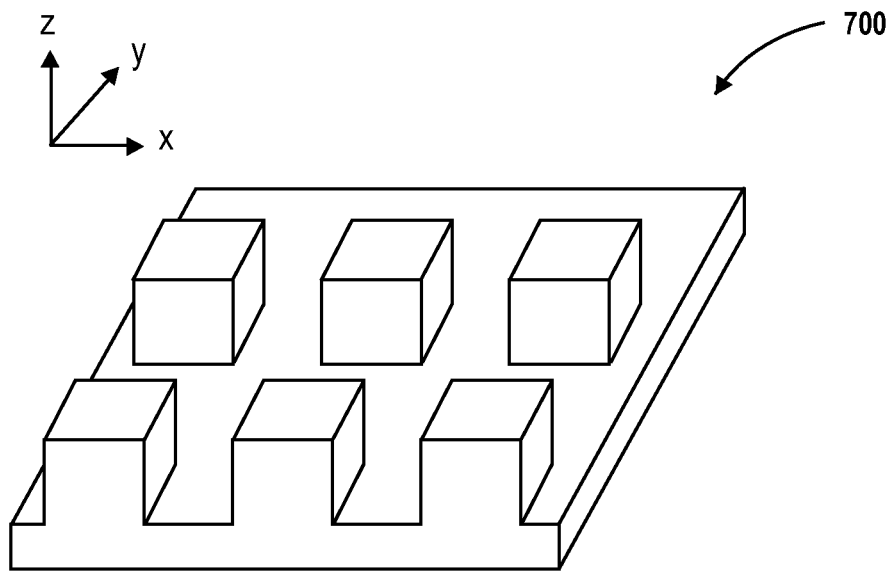
FIG. 7A depicts a periodic grating having a profile that varies in the x-y plane for modeling in accordance with an embodiment.

In an embodiment, optimizing a model of a structure includes using a three-dimensional grating structure. The term "three-dimensional grating structure" is used herein to refer to a structure having an x-y profile that varies in two horizontal dimensions in addition to a depth in the z-direction. For example, FIG. 7A depicts a periodic grating 700 having a profile that varies in the x-y plane for modeling in accordance with an embodiment. The profile of the periodic grating varies in the z-direction as a function of the x-y profile.

Figure 7B:
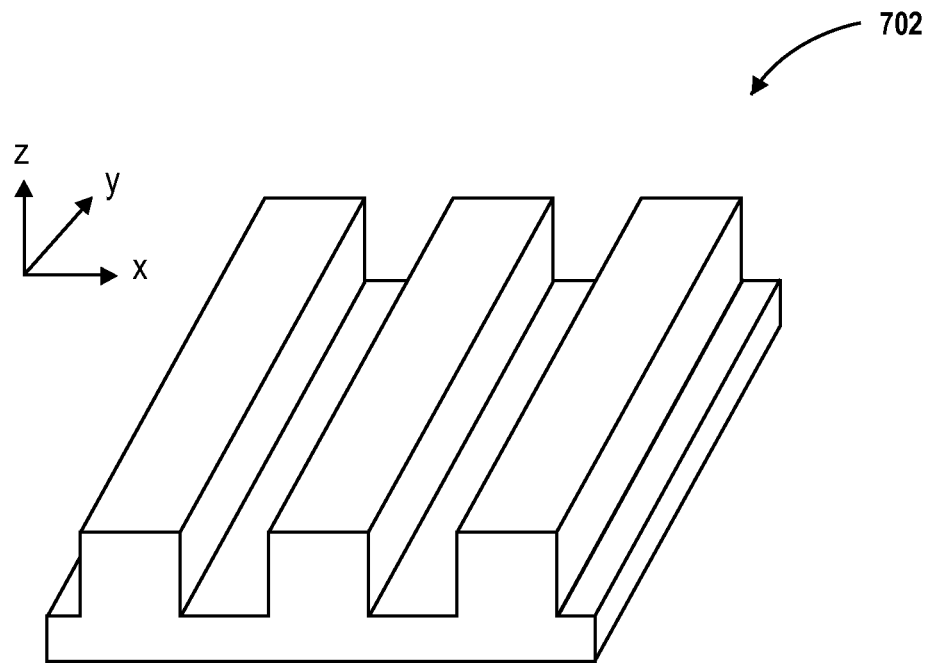
FIG. 7B depicts a periodic grating having a profile that varies in the x-direction but not in the y-direction for modeling in accordance with an embodiment.

In an embodiment, optimizing a model of a structure includes using a two-dimensional grating structure. The term "two-dimensional grating structure" is used herein to refer to a structure having an x-y profile that varies in only one horizontal dimension in addition to a depth in the z-direction. For example, FIG. 7B depicts a periodic grating 702 having a profile that varies in the x-direction but not in the y-direction for modeling in accordance with an embodiment. The profile of the periodic grating varies in the z-direction as a function of the x profile. It is to be understood that the lack of variation in the y-direction for a two-dimensional structure need not be infinite, but any breaks in the pattern are considered long range, e.g., any breaks in the pattern in the y-direction are spaced substantially further apart than the breaks in the pattern in the x-direction.

Embodiments may be suitable for a variety of film stacks. For example, in an embodiment, a method for optimizing a parameter of a critical dimension (CD) profile or structure is performed for a film stack including an insulating film, a semiconductor film and a metal film formed on a substrate. In an embodiment, the film stack includes a single layer or multiple layers. Also, in an embodiment, an analyzed or measured grating structure includes both a three-dimensional component and a two-dimensional component. For example, the efficiency of a computation based on simulated diffraction data may be optimized by taking advantage of the simpler contribution by the two-dimensional component to the overall structure and the diffraction data thereof.

Figure 8:
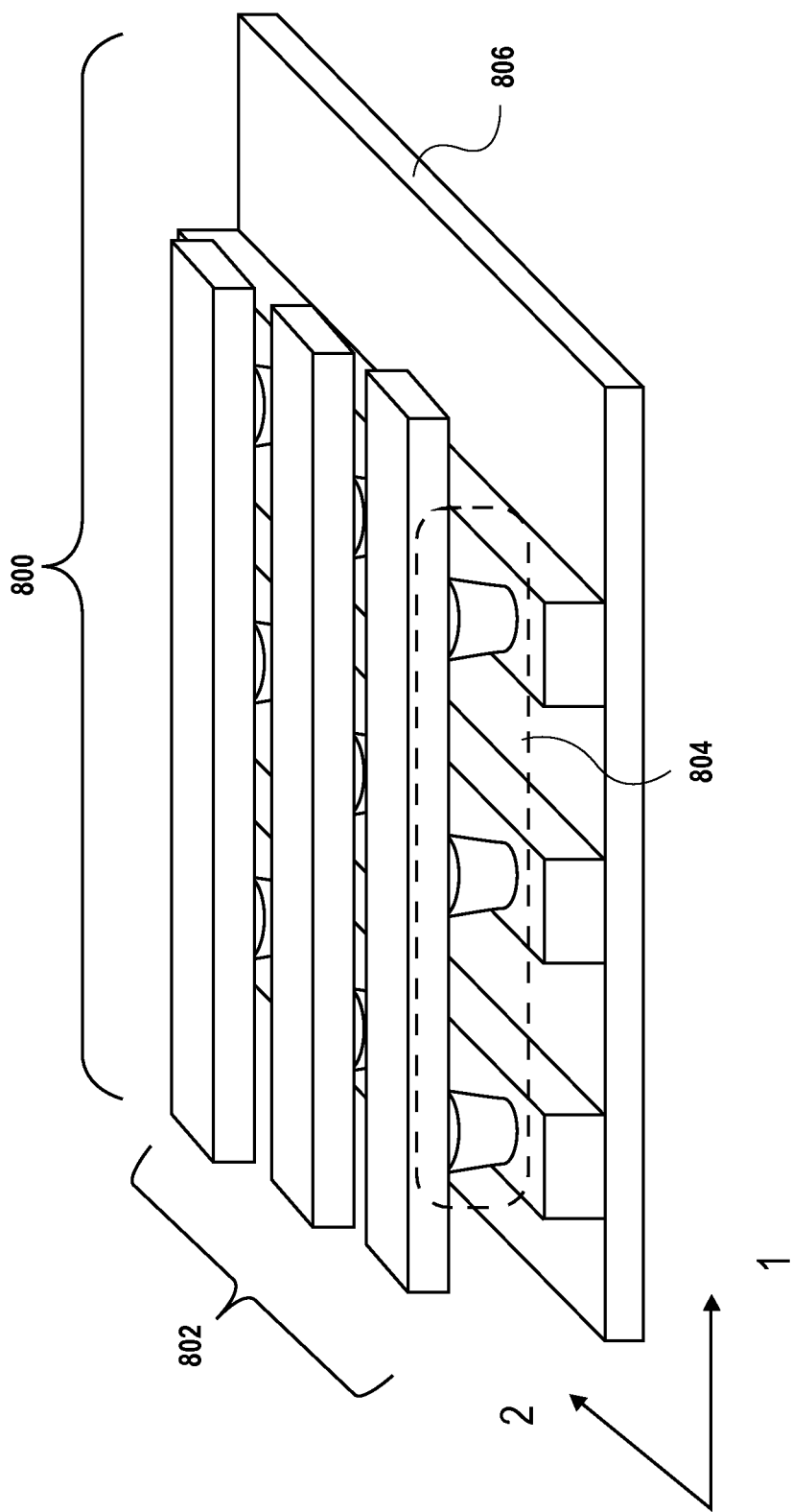
FIG. 8 represents a cross-sectional view of a structure having both a two-dimensional component and a three-dimensional component for modeling in accordance with an embodiment.

FIG. 8 represents a cross-sectional view of a structure having both a two-dimensional component and a three-dimensional component for modeling in accordance with an embodiment. Referring to FIG. 8, a structure 800 has a two-dimensional component 802 and a three-dimensional component 804 above a substrate 806. The grating of the two-dimensional component runs along direction 2, while the grating of the three-dimensional component runs along both directions 1 and 2. In one embodiment, direction 1 is orthogonal to direction 2, as depicted in FIG. 8. In another embodiment, direction 1 is non-orthogonal to direction 2.

In some embodiments, an apparatus, system, or method provides automatic wavelength or angle pruning for optical metrology measurement. In some embodiments, the measurement may include diffraction signals from a two- or three-dimensional grating structure generated by an ellipsometric optical metrology system, such as the optical metrology systems 900 or 1050 described below in association with FIGS. 9 and 10, respectively. However, it is to be understood that the same concepts and principles equally apply to the other optical metrology systems, such as reflectometric systems. The diffraction signals represented may account for features of the two- and three-dimensional grating structure such as, but not limited to, profile, dimension, material composition, or film thickness.

Figure 9:
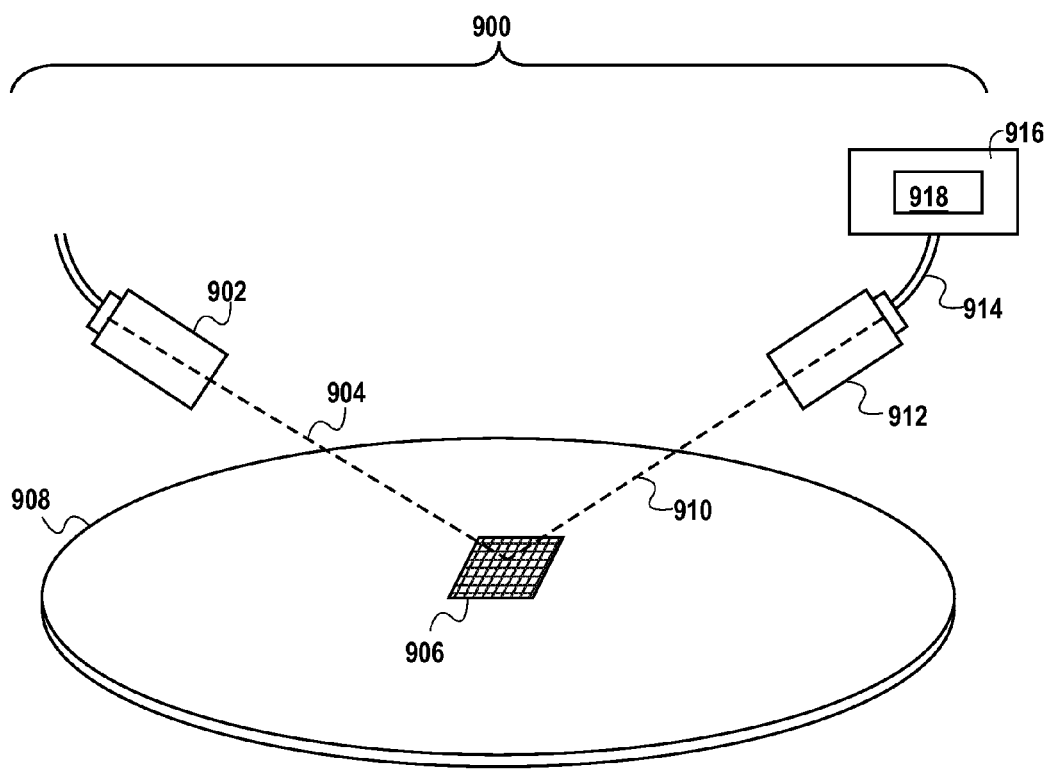
FIG. 9 is an architectural diagram illustrating the utilization of optical metrology to determine parameters of structures on a semiconductor wafer, in accordance with an embodiment.

FIG. 9 is an architectural diagram illustrating the utilization of optical metrology to determine parameters of structures on a semiconductor wafer, in accordance with an embodiment. The optical metrology system 900 includes a metrology beam source 902 projecting an incident metrology beam 904 at the target structure 906 of a wafer 908. The incident metrology beam 904 is projected at an incidence angle θ towards the target structure 906 (θ is the angle between the incident metrology beam 904 and a normal to the target structure 906). The ellipsometer may, in one embodiment, use an incidence angle of approximately 60° to 70°, or may use a lower angle (possibly close to 0° or near-normal incidence) or an angle greater than 70° (grazing incidence). The diffraction beam 910 is measured by a metrology beam receiver 912. The diffraction beam data 914 is transmitted to a profile application server 916. The profile application server 916 may compare the measured diffraction beam data 914 against a library 918 of simulated diffraction beam data representing varying combinations of critical dimensions of the target structure and resolution.

In one exemplary embodiment, the library 918 instance best matching the measured diffraction beam data 914 is selected. It is to be understood that although a library of diffraction spectra or signals and associated hypothetical profiles or other parameters is frequently used to illustrate concepts and principles, embodiments may apply equally to a data space including simulated diffraction signals and associated sets of profile parameters, such as in regression, neural network, and similar methods used for profile extraction. The hypothetical profile and associated critical dimensions of the selected library 918 instance is assumed to correspond to the actual cross-sectional profile and critical dimensions of the features of the target structure 906. The optical metrology system 900 may utilize a reflectometer, an ellipsometer, or other optical metrology device to measure the diffraction beam or signal.

In order to facilitate the description of embodiments, an ellipsometric optical metrology system is used to illustrate the above concepts and principles. It is to be understood that the same concepts and principles apply equally to the other optical metrology systems, such as reflectometric systems. In an embodiment, the optical scatterometry is a technique such as, but not limited to, optical spectroscopic ellipsometry (SE), beam-profile reflectometry (BPR), beam-profile ellipsometry (BPE), and ultra-violet reflectometry (UVR). In a similar manner, a semiconductor wafer may be utilized to illustrate an application of the concept. Again, the methods and processes apply equally to other work pieces that have repeating structures.

Figure 10:
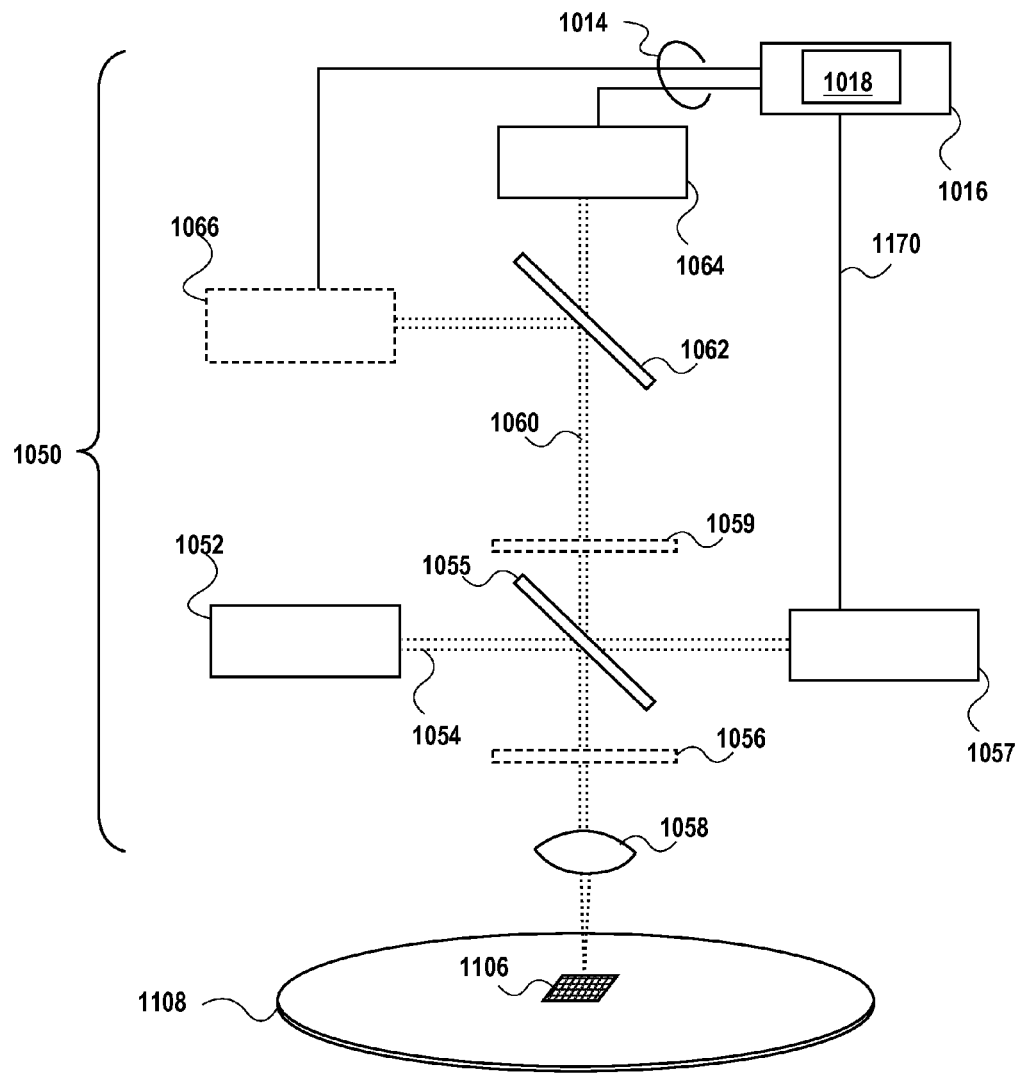
FIG. 10 is an architectural diagram illustrating the utilization of angle-resolved or spectra-resolved beam-profile reflectometry, beam-profile ellipsometry, or both to determine parameters of structures on a semiconductor wafer in accordance with an embodiment.

FIG. 10 is an architectural diagram illustrating the utilization of beam-profile reflectometry, beam-profile ellipsometry, or both to determine parameters of structures on a semiconductor wafer in accordance with an embodiment. The optical metrology system 1050 includes a metrology beam source 1052 generating a polarized metrology beam 1054. Preferably this metrology beam has a narrow bandwidth of 10 nanometers or less. In some embodiments, the metrology beam source 1052 is capable of outputting beams of different wavelengths by switching filters or by switching between different lasers or super-bright light emitting diodes. Part of this beam is reflected from the beam splitter 1055 and focused onto the target structure 1006 of a wafer 1008 by objective lens 1058, which has a high numerical aperture (NA), preferably an NA of approximately 0.9 or 0.95. The portion of the polarized metrology beam 1054 that is not reflected from the beam splitter is directed to beam intensity monitor 1057. The metrology beam may, optionally, pass through a quarter-wave plate 1056 before the objective lens 1058.

After reflection from the target the reflected beam 1060 passes back through the objective lens and is directed to one or more detectors. If optional quarter-wave plate 1056 is present, the beam will pass back through that quarter-wave plate before being transmitted through the beam splitter 1055. After the beam-splitter, the reflected beam 1060 may optionally pass through a quarter-wave plate at location 1059 as an alternative to location 1056. If the quarter-wave plate is present at location 1056, it will modify both the incident and reflected beams. If it is present at location 1059, it will modify only the reflected beam. In some embodiments, no wave plate may be present at either location, or the wave plate may be switched in and out depending on the measurement to be made. It is to be understood that in some embodiments it might be desirable that the wave plate have a retardance substantially different from a quarter wave, i.e. the retardance value might be substantially greater than, or substantially less than, 90°.

A polarizer or polarizing beam splitter 1062 directs one polarization state of the reflected beam 1060 to detector 1064, and, optionally, directs a different polarization state to an optional second detector 1066. The detectors 1064 and 1066 might be one-dimensional (line) or two-dimensional (array) detectors. Each element of a detector corresponds to a different combination of AOI and azimuthal angles for the corresponding ray reflected from the target. The diffraction beam data 1014 from the detector(s) is transmitted to the profile application server 1016 along with beam intensity data 1070. The profile application server 1016 may compare the measured diffraction beam data 1014 after normalization or correction by the beam intensity data 1070 against a library 1018 of simulated diffraction beam data representing varying combinations of critical dimensions of the target structure and resolution.

For more detailed descriptions of systems that could be used to measure the diffraction beam data or signals for use with embodiments, see U.S. Pat. No. 6,734,967, entitled FOCUSED BEAM SPECTROSCOPIC ELLIPSOMETRY METHOD AND SYSTEM, filed on Feb. 11, 1999, and U.S. Pat. No. 6,278,519 entitled APPARATUS FOR ANALYZING MULTI-LAYER THIN FILM STACKS ON SEMICONDUCTORS, filed Jan. 29, 1998, both of which are incorporated herein by reference in their entirety. These two patents describe metrology systems that may be configured with multiple measurement subsystems, including one or more of a spectroscopic ellipsometer, a single-wavelength ellipsometer, a broadband reflectometer, a DUV reflectometer, a beam-profile reflectometer, and a beam-profile ellipsometer. These measurement subsystems may be used individually, or in combination, to measure the reflected or diffracted beam from films and patterned structures. The signals collected in these measurements may be analyzed to determine parameters of structures on a semiconductor wafer in accordance with embodiments.

Embodiments may be provided as a computer program product, or software, that may include a machine-readable medium having stored thereon instructions, which may be used to program a computer system (or other electronic devices) to perform a process according an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 11:
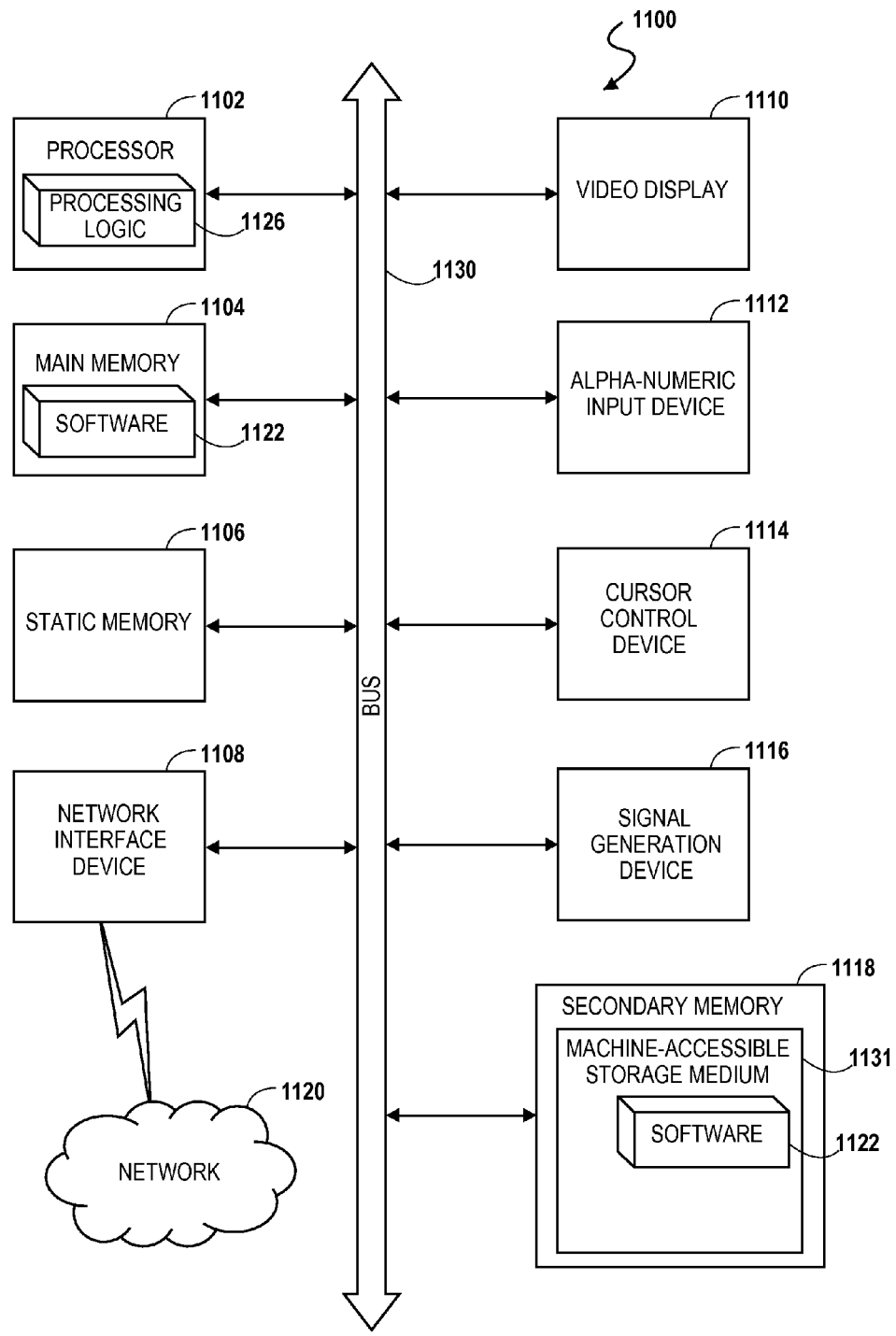
FIG. 11 illustrates a block diagram of a machine in the exemplary form of a computer system in accordance with an embodiment.

FIG. 11 illustrates a block diagram of a machine in the exemplary form of a computer system in accordance with an embodiment within which a set of instructions, for causing the computer to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 1100 includes a processor 1102, a main memory 1104 (e.g., read-only memory (ROM), flash memory, dynamic random access memory (DRAM) such as synchronous DRAM (SDRAM) or Rambus DRAM (RDRAM), etc.), a static memory 1106 (e.g., flash memory, static random access memory (SRAM), etc.), and a secondary memory 1118 (e.g., a data storage device), which communicate with each other via a bus 1130. In some embodiments, datasets for optical metrology may be stored in one or both of the static memory 1106 and the secondary memory 1118, wherein the datasets may be modified by automatic wavelength or angle pruning for optical metrology.

Processor 1102 represents one or more general-purpose processing devices such as a microprocessor, central processing unit, or the like. More particularly, the processor 1102 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1102 may also be one or more special-purpose processing devices such as an application specific integrated circuit (ASIC), a field programmable gate array (FPGA), a digital signal processor (DSP), network processor, or the like. Processor 1102 is configured to execute the processing logic 1126 for performing the operations discussed herein. In some embodiments, processor 1102 provides some or all of the processing for automatic wavelength or angle pruning for optical metrology.

The computer system 1100 may further include a network interface device 1108. The computer system 1100 also may include a video display unit 1110 (e.g., a liquid crystal display (LCD) or a cathode ray tube (CRT)), an alphanumeric input device 1112 (e.g., a keyboard), a cursor control device 1114 (e.g., a mouse), and a signal generation device 1116 (e.g., a speaker).

The secondary memory 1118 may include a machine-accessible storage medium (or more specifically a computer-readable storage medium) 1131 on which is stored one or more sets of instructions (e.g., software 1122) embodying any one or more of the methodologies or functions described herein. The software 1122 may also reside, completely or at least partially, within the main memory 1104 and/or within the processor 1102 during execution thereof by the computer system 1100, the main memory 1104 and the processor 1102 also constituting machine-readable storage media. The software 1122 may further be transmitted or received over a network 1120 via the network interface device 1108.

While the machine-accessible storage medium 1131 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In some embodiments, a machine-accessible storage medium includes instruction stored thereon that cause a data processing system to perform automatic wavelength or angle pruning for optical metrology, It is to be understood that the above methodologies may be applied under a variety of circumstances within the spirit and scope of embodiments. For example, in an embodiment, measurements described above are performed with or without the presence of background light. In an embodiment, a method described above is performed in a semiconductor, solar, light-emitting diode (LED), or a related fabrication process. In an embodiment, a method described above is used in a stand-alone or an integrated metrology tool.

Figure 12:
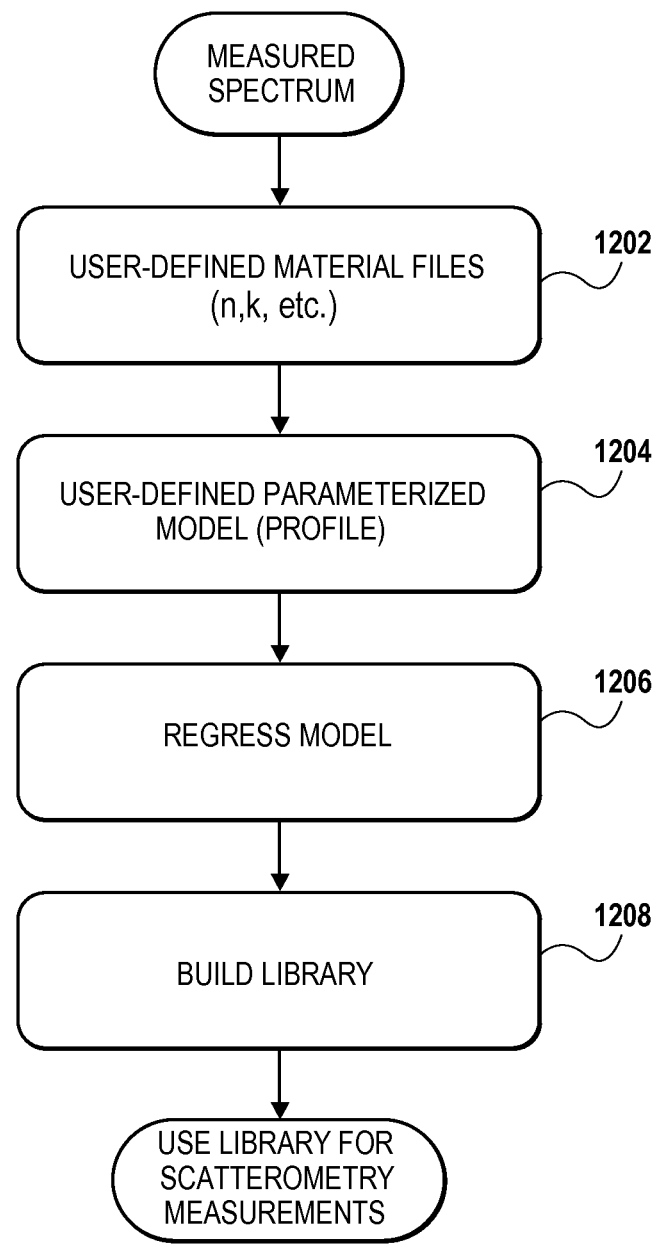
FIG. 12 is a flowchart representing operations in a method for a building parameterized model and a spectral library beginning with sample spectra in accordance with an embodiment.

Analysis of measured spectra generally involves comparing the measured sample spectra to simulated spectra to deduce parameter values of a model that best describe the measured sample. FIG. 12 is a flowchart 1200 representing operations in a method for a building a parameterized model and a spectral library beginning with sample spectra (e.g., originating from one or more work pieces) in accordance with an embodiment.

At operation 1202, a set of material files are defined by a user to specify characteristics (e.g., refractive index or n, k values) of the material(s) from which the measured sample feature is formed.

At operation 1204, a scatterometry user defines a nominal model of the expected sample structure by selecting one or more of the material files to assemble a stack of materials corresponding to those present in the periodic grating features to be measured. Such a user-defined model may be further parameterized through definition of nominal values of model parameters, such as thicknesses, critical dimension (CD), sidewall angle (SWA), height (HT), edge roughness, corner rounding radius, etc. which characterize the shape of the feature being measured. Depending on whether a two-dimensional model (i.e., a profile) or three-dimensional model is defined, it is not uncommon to have 30-50, or more, such model parameters.

From a parameterized model, simulated spectra for a given set of grating parameter values may be computed using rigorous diffraction modeling algorithms, such as rigorous coupled wave analysis (RCWA). Regression analysis is then performed at operation 1206 until the parameterized model converges on a set of parameter values characterizing a final profile model (for two-dimensional) that corresponds to a simulated spectrum which matches the measured diffraction spectra to a predefined matching criterion. The final profile model associated with the matching simulated diffraction signal is presumed to represent the actual profile of the structure from which the model was generated.

The matching simulated spectra and/or associated optimized profile model can then be utilized at operation 1208 to build a library of simulated diffraction spectra by perturbing the values of the parameterized final profile model. The resulting library of simulated diffraction spectra may then be employed by a scatterometry measurement system operating in a production environment to determine whether subsequently measured grating structures have been fabricated according to specifications. Library generation 1208 may include a machine learning system, such as a neural network, generating simulated spectral information for each of a number of profiles, each profile including a set of one or more modeled profile parameters. In order to generate the library, the machine learning system itself may have to undergo some training based on a training dataset of spectral information. Such training may be computationally intensive and/or may have to be repeated for different models and/or profile parameter domains. Considerable inefficiency in the computational load of generating a library may be introduced by a user's decisions regarding the size of a training dataset. For example, selection of an overly large training dataset may result in unnecessary computations for training while training with a training dataset of insufficient size may necessitate a retraining to generate a library.

For some applications it may be unnecessary to build a library. After the parametric model of the structure has been created and optimized, a regression analysis similar to that described above may be used in real time to determine the best fitting parameter values for each target as the diffraction beam data are collected. If the structure is relatively simple (for example a 2D structure), or if only a small number of parameters need to be measured, regression may be fast enough even though it may be slower than using a library. In other cases, the extra flexibility of using regression may justify some increase in measurement time over using a library. For a more detailed description of methods and systems that are capable of real-time regression of OCD data for use with an embodiment, see U.S. Pat. No. 7,031,848, entitled REAL TIME ANALYSIS OF PERIODIC STRUCTURES ON SEMICONDUCTORS, filed on Jul. 8, 2005, which is incorporated herein by reference in its entirety.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

What is claimed is:

1. A method for automatic wavelength or angle pruning for optical metrology, the method comprising:
    determining a model of a target microelectronic structure including at least a first geometric parameter and a second geometric parameter of the target microelectronic structure, wherein the second geometric parameter is different than the first geometric parameter;
    designing and generating a dataset that includes:
        1) a first set of datapoints for a set of wavelengths or a set of angles, wherein the first set of datapoints for the set of wavelengths or the set of angles are derived from a set of values for the first geometric parameter, and
        2) a second set of datapoints for the set of wavelengths or the set of angles, wherein the second set of datapoints for the set of wavelengths or the set of angles are derived from a set of values for the second geometric parameter;
    storing the dataset in a computer memory;
    performing with a processor an analysis of the dataset for the model including:
        applying an outlier detection technology on the dataset, and
        identifying any datapoint outliers within the first and second sets of datapoints for the set of wavelengths or the set of angles of the dataset;
    if any datapoint outliers are identified in the analysis of the dataset of the model,
        removing any wavelengths or angles corresponding to the datapoint outliers from the set of wavelengths or the set of angles to produce a subset of wavelengths or a subset of angles,
        generating a modified dataset that includes
            1) a first set of datapoints for the subset of wavelengths or the subset of angles, wherein the first set of datapoints for the subset of wavelengths or the subset of angles are derived from the first set of values for the first geometric parameter, and
            2) a second set of datapoints for the subset of wavelengths or the subset of angles, wherein the second set of datapoints for the subset of wavelengths or the subset of angles are derived from the second set of values for the second geometric parameter, and
        storing the modified dataset in the computer memory; and
    performing optical metrology of the target microelectronic structure with an optical metrology system using the modified stored dataset of the model to measure a diffraction signal,
    wherein the first geometric parameter and the second geometric parameter are each one of a height (HT), a middle critical dimension (MCD), a top critical dimension (TCD), or a sidewall angle (SWA).

2. The method of claim 1, the method further comprising:
    if any datapoint outliers are identified in the analysis of the dataset of the model, performing another iteration of the analysis of the dataset.

3. The method of claim 1, wherein the performance of another iteration of the analysis of the dataset after a first iteration is optional, and wherein performing optical metrology of the target structure includes using the stored dataset from the first iteration.

4. The method of claim 1, wherein:
    performing optical metrology of the target structure includes, if no datapoint outliers are identified in an iteration of the analysis of the dataset of the model, then performing optical metrology of the target structure using the stored dataset.

5. The method of claim 1, wherein a datapoint outlier within the dataset has a corresponding wavelength or angle at or near a Wood anomaly, wherein upon identification of the datapoint outlier, the corresponding wavelength or angle is removed from the set of wavelengths or the set of angles, respectively.

6. The method of claim 1, wherein a datapoint outlier within the dataset has a corresponding wavelength or angle at or near a structure resonance, wherein upon identification of the outlier, the corresponding wavelength or angle is removed from the set of wavelengths or the set of angles, respectively.

7. The method of claim 1, wherein the outlier detection technology includes one of:
   a distance-based algorithm;
   a depth-based algorithm;
   a deviation-based algorithm; or
   a pattern-based algorithm.

8. The method of claim 1, wherein one or more wavelengths or angles are removed without application of an electromagnetic solver.

9. The method of claim 1, wherein one or more wavelengths or angles are removed without physical modeling of Wood anomalies or structure resonances.

10. The method of claim 1, wherein the optical metrology performed includes the use of one or more of spectroscopic ellipsometers, angle-resolved ellipsometers, spectroscopic reflectometers, and angle-resolved reflectometers.

11. A non-transitory machine-accessible storage medium having instructions stored thereon which when executed cause a data processing system to perform a method of automatic wavelength or angle pruning for optical metrology, the method comprising:
   determining a model of a target microelectronic structure including at least a first geometric parameter and a second geometric parameter of the target microelectronic structure that is different than the first geometric parameter;
   designing and generating a dataset that includes:
      1) a first set of datapoints for a set of wavelengths or a set of angles, wherein the first set of datapoints for the set of wavelengths or the set of angles are derived from a set of values for the first geometric parameter, and
      2) a second set of datapoints for the set of wavelengths or the set of angles, wherein the second set of datapoints for the set of wavelengths or the set of angles are derived from a set of values for the second geometric parameter;
   storing the dataset in a computer memory;
   performing with a processor an analysis of the dataset for the model including:
      applying an outlier detection technology on the dataset, and
      identifying any datapoints outliers within the first and second sets of datapoints for the set of wavelengths or the set of angles of the dataset;
   if any datapoint outliers are identified in the analysis of the dataset of the model,
      removing any wavelengths or angles corresponding to the datapoint outliers from the set of wavelengths or the set of angles to produce a subset of wavelengths or a subset of angles,
      generating a modified dataset that includes
         1) a first set of datapoints for the subset of wavelengths or the subset of angles, wherein the first set of datapoints for the subset of wavelengths or the subset of angles are derived from the first set of values for the first geometric parameter, and
         2) a second set of datapoints for the subset of wavelengths or the subset of angles, wherein the second set of datapoints for the subset of wavelengths or the
      subset of angles are derived from the second set of values for the second geometric parameter, and
      storing the modified dataset in the computer memory; and
   performing optical metrology of the target structure with an optical metrology system using the modified stored dataset of the model to measure a diffraction signal,
   wherein the first geometric parameter and the second geometric parameter are each one of a height (HT), a middle critical dimension (MCD), a top critical dimension (TCD), or a sidewall angle (SWA).

12. The storage medium of claim 11, the method further comprising:
   if any datapoint outliers are identified in the analysis of the dataset of the model, performing another iteration of the analysis of the dataset.

13. The storage medium of claim 11, wherein the performance of another iteration of the analysis of the dataset after a first iteration is optional, and wherein performing optical metrology of the target structure includes using the stored dataset from the first iteration.

14. The storage medium of claim 11, wherein:
   performing optical metrology of the target structure includes, if no datapoint outliers are identified in an iteration of the analysis of the dataset of the model, then performing optical metrology of the target structure using the stored dataset.

15. The storage medium of claim 11, wherein a datapoint outlier within the dataset has a corresponding wavelength or angle at or near a Wood anomaly, wherein upon identification of the datapoint outlier, the corresponding wavelength or angle is removed from the set of wavelengths or the set of angles, respectively.

16. The storage medium of claim 11, wherein a datapoint outlier within the dataset a corresponding wavelength or angle at or near a structure resonance, wherein upon identification of the outlier, the corresponding wavelength or angle is removed from the set of wavelengths or the set of angles, respectively.

17. The storage medium of claim 11, wherein the outlier detection technology includes one of:
   a distance-based algorithm;
   a depth-based algorithm;
   a deviation-based algorithm; or
   a pattern-based algorithm.

18. The storage medium of claim 11, wherein one or more wavelengths or angles are removed without application of an electromagnetic solver.

19. The storage medium of claim 11, wherein one or more wavelengths or angles are removed without physical modeling of Wood anomalies or structure resonances.

20. The storage medium of claim 11, wherein the optical metrology includes one or more of spectroscopic ellipsometers, angle-resolved ellipsometers, spectroscopic reflectometers, and angle-resolved reflectometers.

21. A system comprising:
   an optical metrology system configured to determine one or more process parameters of a target structure, the optical metrology system comprising:
      a beam source and detector configured to measure a diffraction signal of the target structure;
      a processor configured to process measurement data; and a computer memory to store data;
wherein the optical metrology system is configured to provide automatic wavelength or angle pruning for optical metrology, including:
  determining a model of the target structure including at least a first geometric parameter and a second geometric parameter of the target structure, wherein the second geometric parameter is different than the first geometric parameter;
  designing and generating a dataset that includes:
    1) a first set of datapoints for a set of wavelengths or a set of angles, wherein the first set of datapoints for the set of wavelengths or the set of angles are derived from a set of values for the first geometric parameter, and
    2) a second set of datapoints for the set of wavelengths or a set of angles, wherein the second set of datapoints for the set of wavelengths or the set of angles are derived from a set of values for the second geometric parameter;
  storing the dataset in the computer memory;
  performing with the processor an analysis of the dataset for the model including:
    applying an outlier detection technology on the dataset, and
    identifying any datapoint outliers within the first and second sets of datapoints for the set of wavelengths or the set of angles of the dataset;
  if any datapoint outliers are identified in the analysis of the dataset of the model,
    removing any wavelengths or angles corresponding to the datapoint outliers from the set of wavelengths or the set of angles to produce a subset of wavelengths or a subset of angles,
    generating a modified dataset that includes:
      1) a first set of datapoints for the subset of wavelengths or the subset of angles, wherein the first set of datapoints for the subset of wavelengths or the subset of angles are derived from the first set of values for the first geometric parameter, and
      2) a second set of datapoints for the subset of wavelengths or the subset of angles, wherein the second set of datapoints for the subset of wavelengths or the subset of angles are derived from the second set of values for the second geometric parameter, and
    storing the modified dataset in the computer memory, and
    performing optical metrology of the target structure using the modified stored dataset of the model to measure a diffraction signal,
  wherein the first geometric parameter and the second geometric parameter are each one of a height (HT), a middle critical dimension (MCD), a top critical dimension (TCD), or a sidewall angle (SWA).

22. The system of claim 21, the automatic wavelength or angle pruning for optical metrology further including:
  if any datapoint outliers are identified in the analysis of the data set of the model, performing another iteration of the analysis of the dataset.

23. The system of claim 21, wherein the performance of another iteration of the analysis of the dataset after a first iteration is optional, and the automatic wavelength or angle pruning for optical metrology further including performing optical metrology of the target structure using the stored dataset from the first iteration.

24. The system of claim 21, the automatic wavelength or angle pruning for optical metrology further including:
  if no datapoint outliers are identified in an iteration of the analysis of the dataset of the model, performing optical metrology of the target structure using the stored dataset.

25. The system of claim 21, wherein a datapoint outlier within the dataset has a corresponding wavelength or angle at or near a Wood anomaly, wherein upon identification of the datapoint outlier, the corresponding wavelength or angle is removed from the set of wavelengths or the set of angles, respectively.

26. The system of claim 21, wherein a datapoint outlier within the dataset has a corresponding wavelength or angle at or near a structure resonance, wherein upon identification of the datapoint outlier, the corresponding wavelength or angle is removed from the set of wavelengths or the set of angles, respectively.

27. The system of claim 21, wherein the outlier detection technology includes one of:
  a distance-based algorithm;
  a depth-based algorithm;
  a deviation-based algorithm; or
  a pattern-based algorithm.

28. The system of claim 21, wherein the optical metrology system includes one of a spectroscopic or angle-resolved ellipsometer or spectroscopic or angle-resolved reflectometer.

* * * * *